US011937411B2

(12) United States Patent
Kim

(10) Patent No.: US 11,937,411 B2
(45) Date of Patent: Mar. 19, 2024

(54) CONVERTER

(71) Applicant: LG INNOTEK CO., LTD., Seoul (KR)

(72) Inventor: Ki Dong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 100 days.

(21) Appl. No.: 17/441,727

(22) PCT Filed: Mar. 30, 2020

(86) PCT No.: PCT/KR2020/004340
§ 371 (c)(1),
(2) Date: Sep. 22, 2021

(87) PCT Pub. No.: WO2020/204534
PCT Pub. Date: Oct. 8, 2020

(65) Prior Publication Data
US 2022/0192058 A1 Jun. 16, 2022

(30) Foreign Application Priority Data
Apr. 2, 2019 (KR) .................. 10-2019-0038721

(51) Int. Cl.
*H05K 7/20* (2006.01)
(52) U.S. Cl.
CPC ..... *H05K 7/20909* (2013.01); *H05K 7/20409* (2013.01)
(58) Field of Classification Search
CPC .......... H05K 7/20909; H05K 7/20409; H05K 7/2039; H05K 7/20145; H05K 7/20136; F28F 2215/04; F28F 2215/02; F28F 13/08
See application file for complete search history.

(56) References Cited

U.S. PATENT DOCUMENTS 5,377,745 A * 1/1995 Hsieh .................... H01L 23/467
165/185
5,495,392 A * 2/1996 Shen ..................... H01L 23/467
165/185
(Continued)

FOREIGN PATENT DOCUMENTS

CN 2547924 Y * 4/2003
CN 208518757 U * 2/2019
(Continued)

OTHER PUBLICATIONS

Li, Machine translation of WO2019119266.*
(Continued)

*Primary Examiner* — Jacob R Crum
*Assistant Examiner* — Matthew Sinclair Muir
(74) *Attorney, Agent, or Firm* — Birch, Stewart, Kolasch & Birch, LLP

(57) ABSTRACT

A converter includes a housing; a heat-generating component disposed inside the housing; and a heat-dissipating module disposed on the heat-generating component and having a heat-dissipating member, an inlet adjacently disposed on one side of the heat-dissipating member, and an outlet adjacently disposed on the other side of the heat-dissipating member. The heat-dissipating member includes a plurality of heat-dissipating fins and a plurality of flow paths disposed in a direction from the inlet toward the outlet, and the plurality of flow paths are disposed overlapping with the heat-generating component in the vertical direction. A distance between two outermost heat-dissipating fins in a second direction of the heat-dissipating member, among the plurality of heat-dissipating fins, is greater at a central region between the inlet and the outlet of the heat-dissipating member than at a first region near the outlet of the heat-dissipating.

18 Claims, 20 Drawing Sheets

(56) References Cited

U.S. PATENT DOCUMENTS

| | | | | |
|---|---|---|---|---|
| 5,630,469 | A | * | 5/1997 | Butterbaugh ......... H01L 23/467 174/16.3 |
| 5,787,971 | A | * | 8/1998 | Dodson ................ H01L 23/467 257/E23.099 |
| 6,657,860 | B2 | * | 12/2003 | Matsui .................... G06F 1/203 174/16.3 |
| 6,681,845 | B1 | * | 1/2004 | Yeh ........................... G06F 1/20 165/122 |
| 7,174,952 | B1 | * | 2/2007 | Hong ................... H01L 23/467 165/122 |
| 7,613,001 | B1 | * | 11/2009 | Liu .................... H05K 7/20336 361/679.52 |
| 2004/0163795 | A1 | * | 8/2004 | Lin ....................... H01L 23/467 257/E23.099 |
| 2008/0239661 | A1 | * | 10/2008 | McClellan ......... H05K 7/20154 361/690 |
| 2010/0302730 | A1 | | 12/2010 | Hernon |
| 2011/0069451 | A1 | | 3/2011 | Hobein et al. |
| 2012/0182689 | A1 | | 7/2012 | Donth et al. |
| 2015/0349392 | A1 | * | 12/2015 | Smith ................. H01M 10/613 429/50 |
| 2016/0085247 | A1 | | 3/2016 | Smith et al. |

FOREIGN PATENT DOCUMENTS

| | | | |
|---|---|---|---|
| CN | 113905568 A | * | 1/2022 |
| EP | 0 356 991 A1 | | 3/1990 |
| JP | 3095592 B2 | | 10/2000 |
| JP | 2014-192991 A | | 10/2014 |
| JP | 2015-79818 A | | 4/2015 |
| JP | 2017-188570 A | | 10/2017 |
| KP | 2003-199292 A | | 7/2003 |
| KR | 10-2015-0136990 A | | 12/2015 |
| TW | M243852 U | * | 9/2004 |
| WO | WO-9948346 A1 | * | 9/1999 ........... H01L 23/467 |
| WO | WO-2019119266 A1 | * | 6/2019 ......... H05K 7/20145 |

OTHER PUBLICATIONS

Horita, Machine translation of WO9948346.*
Lin, Machine translation of CN2547924.*
TWM243852U Translation.*

* cited by examiner

CONVERTER

CROSS REFERENCE TO RELATED APPLICATIONS

This application is the National Phase of PCT International Application No. PCT/KR2020/004340, filed on Mar. 30, 2020, which claims priority under 35 U.S.C. 119(a) to patent application Ser. No. 10-2019-0038721, filed in the Republic of Korea on Apr. 2, 2019, all of which are hereby expressly incorporated by reference into the present application.

TECHNICAL FIELD

The present embodiment relates to a converter.

BACKGROUND ART

The following description provides background information on the present embodiment, and does not describe the prior art.

Engine electric devices (starting devices, ignition devices, charging devices) and lighting devices are generally used as electric devices of automobiles, but in recent years, most systems including chassis electric devices are becoming electrified as vehicles are more electronically controlled.

Various electrical equipment such as lamps, audio, heaters, air conditioners, and the like installed in automobiles are supplied with power from the battery when the vehicle is stopped, and power from the generator when driving, and at this time, the power generation capacity of the 14V power system is used as the normal power supply voltage.

Recently, with the development of the information technology industry, various new technologies (motor-type power steering, Internet, and the like) aiming to increase the convenience of automobiles are being adopted into vehicles, and the development of new technologies capable of maximally utilizing the current automotive system is expected to be continued in the future.

Regardless of soft or hard type, a hybrid electric vehicle (HEV) is equipped with a DC-DC converter for supplying an electric load (12V). In addition, the DC-DC converter, which acts as a generator (alternator) of a general gasoline vehicle, supplies 12V of voltage for electric load by reducing the high voltage of the main battery (usually a high voltage battery of 144V or higher).

A DC-DC converter refers to an electronic circuit device that converts DC power of a certain voltage to DC power of another voltage, and is used in various fields such as TV sets and automotive electronics.

A plurality of electric elements generating heat by driving are disposed inside the converter. In general, the heat-dissipating of the converter may be composed of a structure in which one or more heat-dissipating fins are disposed on an outer surface of a housing forming an external shape. That is, it is a structure in which the heat generated from the electric element is conducted to the outside through the housing, and the heat is radiated to the outside through the heat-dissipating fins. However, there is a problem in that the heat-dissipating of the converter cannot be sufficiently accomplished only with the heat-dissipating fins, considering that the amount of heat generated by each electronic component is different from each other and that a plurality of electronic components are disposed in a narrow space of the converter.

DETAILED DESCRIPTION OF THE INVENTION

Technical Subject

An object of the present embodiment is to provide a converter capable of improving heat-dissipating efficiency by improving the housing structure.

Technical Solution

In one embodiment, a converter comprises: a housing; a heat-generating component disposed inside the housing; and a heat-dissipating module disposed on the heat-generating component, wherein the heat-dissipating module includes a heat-dissipating member, an inlet adjacently disposed on one side of the heat-dissipating member, and an outlet adjacently disposed on the other side of the heat-dissipating member, wherein the heat-dissipating member includes a plurality of heat-dissipating fins and a plurality of flow paths disposed in a direction from the inlet toward the outlet, wherein the plurality of flow paths are disposed overlapping with the heat-generating component in the vertical direction, and wherein the distance between the two heat-dissipating fins, which are disposed on both outermost sides of the other side of the heat-dissipating member, among the plurality of heat-dissipating fins is different from the distance between the two heat-dissipating fins disposed on both outermost sides of a central region between the inlet and the outlet of the heat-dissipating member.

The number of flow paths at the other side of the heat-dissipating member may be different from the number of flow paths in the central region of the heat-dissipating member.

The number of flow paths at the other side of the heat-dissipating member may be smaller than the number of flow paths in the central region of the heat-dissipating member.

The flow path may be formed between the two heat-dissipating fins adjacent to each other.

A length between two heat-dissipating fins disposed on both outermost sides of one side of the heat-dissipating member among the plurality of heat-dissipating fins may be equal to or greater than a length between two heat-dissipating fins disposed at both outermost sides of the other side of the heat-dissipating member.

The number of flow paths at the other side of the heat-dissipating member may be equal to or less than the number of flow paths at the one side.

The heat-dissipating module may include a fan disposed adjacent to the inlet. The heat-dissipating module may include a cover disposed on the plurality of heat-dissipating fins, and the cover may include an inlet and an outlet disposed adjacent to the fan.

The heat-dissipating module includes the plurality of heat-dissipating fins and a cover disposed on the fan, and the cover may include an opening overlapping the fan in a vertical direction. In another embodiment, the converter includes: a housing; a heat-generating component disposed inside the housing; and a heat-dissipating module disposed on the housing, wherein the heat-dissipating module includes a heat-dissipating member, an inlet disposed adjacent to one side of the heat-dissipating member, and an outlet disposed adjacent to the other side of the heat-dissipating member, and wherein the heat-dissipating member includes a plurality of heat-dissipating fins and a plurality of flow paths disposed in a direction from the inlet to the outlet, the plurality of flow passages are disposed to be overlapped with the heat-generating component in a vertical direction, and the size of the inlet is greater than the size of the outlet.

Advantageous Effects

According to the present invention, since the heat generated by the electronic component can be dissipated by a fan that discharges air to the heat-dissipating fins and a region between the heat-dissipating fins, there is an advantage that heat dissipation efficiency can be improved. In addition, since the flow of air flows in the shortest distance in the duct, there is an advantage in that the wind direction and wind speed of the air for heat dissipation can be efficiently controlled.

In addition, there is an advantage that the air discharged from the fan through the air guide can be more easily guided to the duct.

BRIEF DESCRIPTION OF DRAWINGS

FIG. 9b is a cross-sectional view illustrating a modified embodiment of FIG. 9a.

BEST MODE

Hereinafter, preferred embodiments of the present invention will be described in detail with reference to the accompanying drawings.

However, the technical idea of the present invention is not limited to some embodiments to be described, but may be implemented in various forms, and if it is within the scope of the technical idea of the present invention, one or more of the components may be selected, combined, and substituted between the embodiments for use.

In addition, terms (including technical and scientific terms) used in the embodiments of the present invention are generally understood by those of ordinary skill in the technical field to which the present invention belongs unless explicitly defined and described, and it can be interpreted as a meaning, and terms generally used, such as terms defined in a dictionary, may be interpreted in consideration of the meaning in the context of the related technology.

In addition, terms used in the embodiments of the present invention are for describing the embodiments and are not intended to limit the present invention. In the present specification, the singular form may include the plural form unless specifically stated in the phrase, and when described as "at least one (or more than one) of A and B and C", it may contain one or more of all combinations that can be combined with A, B, and C.

In addition, terms such as first, second, A, B, (a), (b), and the like may be used in describing the components of the embodiment of the present invention.

These terms are only for distinguishing the component from other components, and are not limited to the nature, order, or sequence or the like of the component by the term.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when it is described as being formed or disposed in the "top (above) or bottom (below)" of each component, the top (above) or bottom (below) not only includes a case when the two components are in direct contact with each other but also includes a case where one or more other components are formed or disposed between the two components. In addition, when expressed as "top (above) or bottom (below)", the meaning of not only an upward direction but also a downward direction based on one component may be included.

Figure 1:
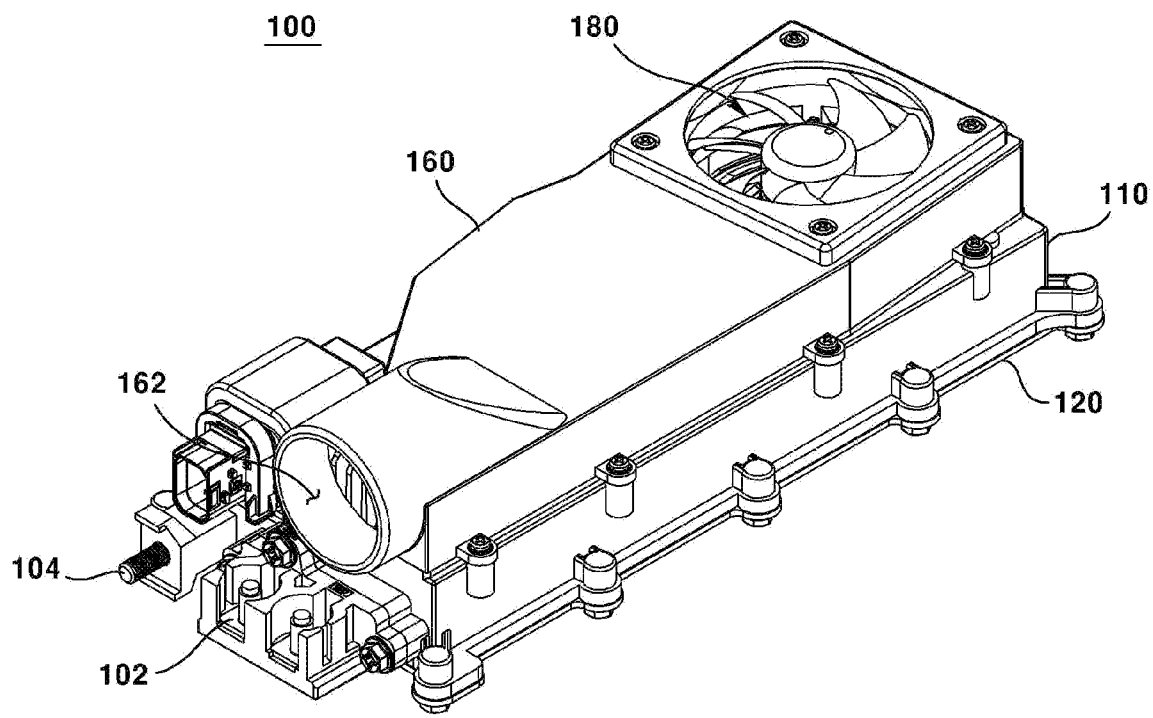
FIG. 1 is a perspective view of a converter according to a first embodiment of the present invention.
Figure 2:
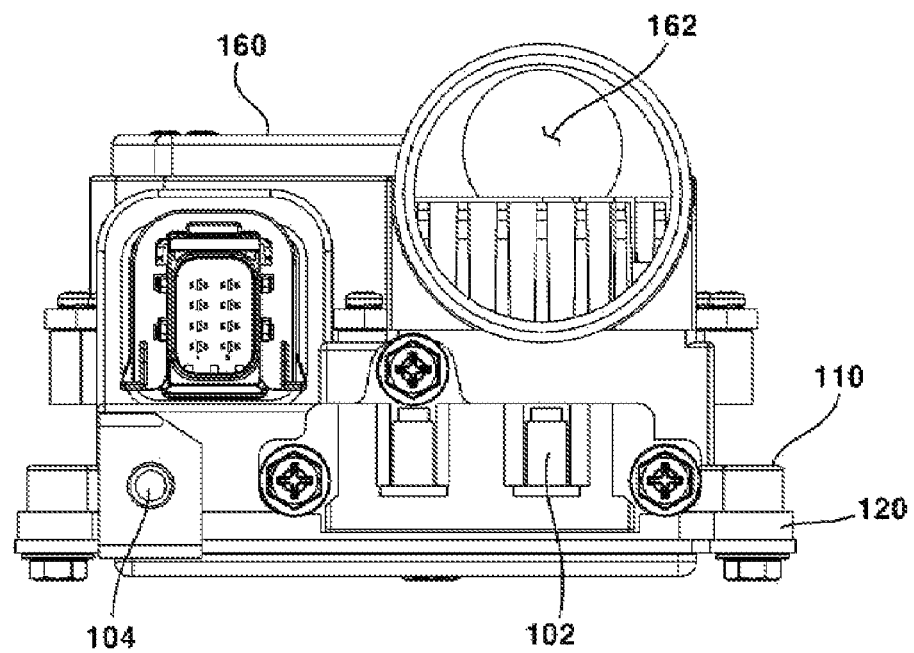
FIG. 2 is a plan view showing one side surface of the converter according to a first embodiment of the present invention.
Figure 3:
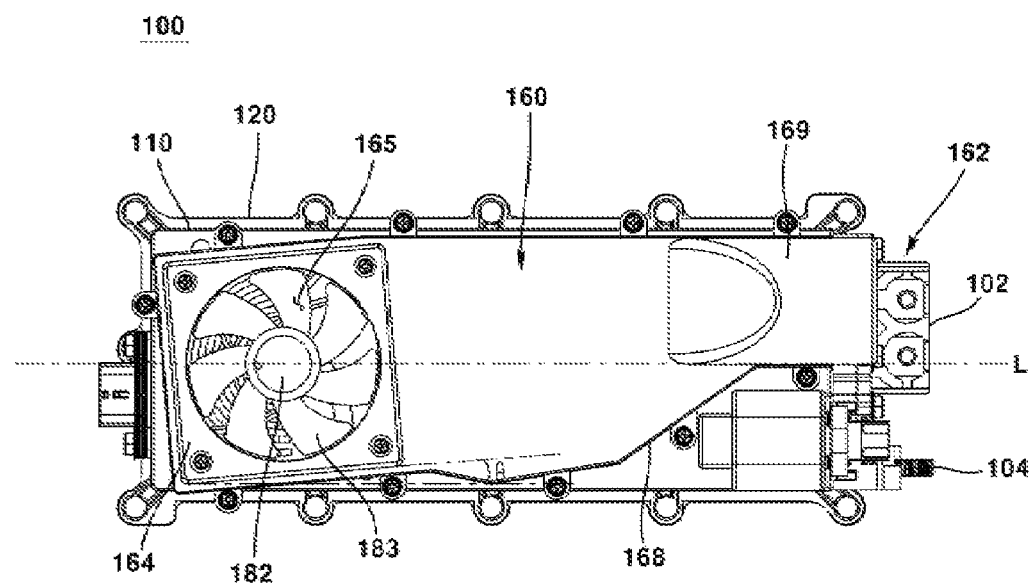
FIG. 3 is a plan view showing an upper surface of the converter according to a first embodiment of the present invention.
Figure 4:
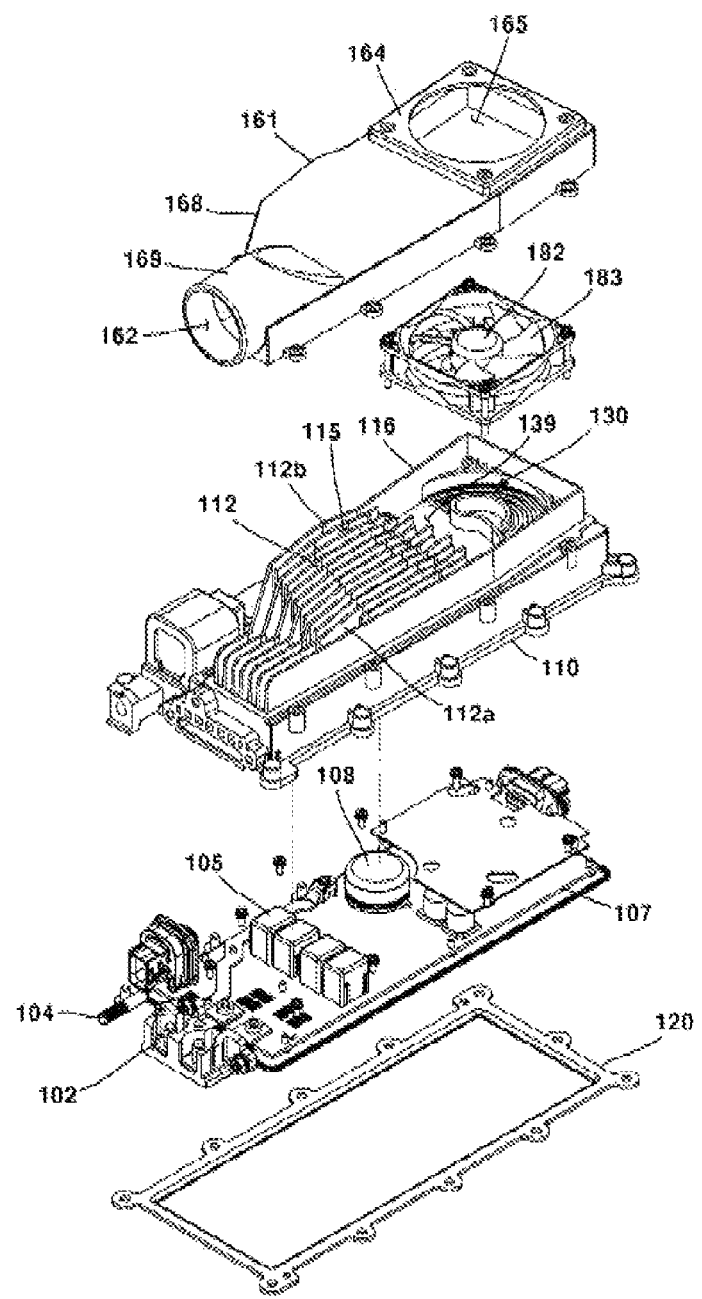
FIG. 4 is an exploded perspective view of a converter according to an embodiment of the present invention.
Figure 5:
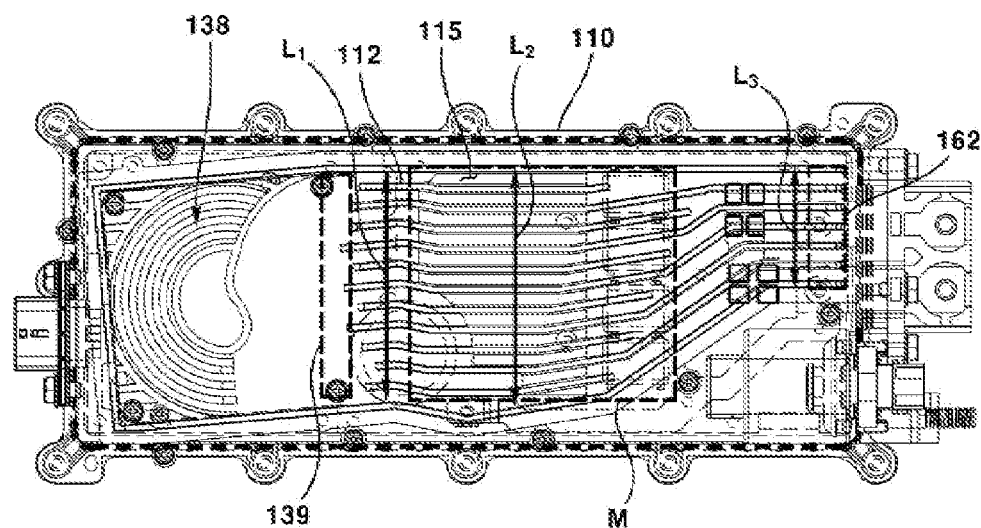
FIG. 5 is a perspective view of a converter illustrated in FIG. 3 excluding the cover.

FIG. 1 is a perspective view of a converter according to a first embodiment of the present invention, FIG. 2 is a plan view showing one side surface of the converter according to a first embodiment of the present invention, FIG. 3 is a plan view showing an upper surface of the converter according to a first embodiment of the present invention, FIG. 4 is an exploded perspective view of a converter according to an embodiment of the present invention, and FIG. 5 is a perspective view of a converter illustrated in FIG. 3 excluding the cover.

Referring to FIGS. 1 to 5, an external shape of the converter 100 according to a first embodiment of the present invention may be formed by a base 120 and a housing 110 coupled to an upper surface of the base 120. The housing 110 may be formed in a rectangular parallelepiped shape with an open lower surface. In addition, the base 120 may be coupled to a lower surface of the housing 110 to cover a space formed in the housing 110. However, this is an example, and of course, the converter 100 may be formed in a single housing structure in the form of a box.

The housing 110 may be formed of a metal material. For example, the material of the housing 110 may be aluminum.

A power terminal 102 and a signal terminal 104 may be respectively disposed on the side surface of the converter 100. The power terminal 102 and the signal terminal 104 are formed to be protruded outward from the side surface of the housing 110, and may be respectively coupled to external connectors. The power terminal 102 and the signal terminal 104 are electrically connected respectively to a heat-generating component (for example, a printed circuit board 107, refer to FIG. 4) disposed inside the housing 110, so that power or a signal from an external configuration can be transmitted or inputted to the converter 100 when combined with an external connector. A through hole (not shown) through which the power terminal 102 and the signal terminal 104 penetrate may be formed in a side surface of the housing 110.

A plurality of electronic components for driving the converter 100 may be disposed in a space inside the housing 110. For example, a printed circuit board 107 on which one or more devices are mounted may be disposed inside the housing 110. The printed circuit board 107 may be formed in a plate shape, and a plurality of electronic components may be disposed on an upper surface of the printed circuit board 107. The printed circuit board 107 is provided in plurality, and may be disposed by forming layers in an up and down directions. As described above, the printed circuit board 107 may be electrically connected to the power terminal 102 and the signal terminal 104, respectively.

One or more heat-generating components that generate heat according to driving may be disposed inside the housing 110. The heat-generating component may be at least a portion of the above-described electronic component.

The heat-generating component may be disposed on an upper surface of the printed circuit board 107. The heat-generating component may include a transformer 108 for voltage regulation, an inductor for inductance, and one or more FET devices 105. Accordingly, heat may be generated from the heat-generating component according to the driving of the converter 100.

A heat-dissipating module is disposed on the housing 110. The heat-dissipating module may include a heat-dissipating member, an inlet 139 disposed on one side of the heat-dissipating member, and an outlet 162 disposed adjacent to the other side of the heat-dissipating member. In addition, the heat-dissipating member may include a plurality of heat-dissipating fins 112 and a plurality of flow paths 115 disposed in a direction from the inlet 139 to the outlet 162.

In more detail, the inlet 139 is disposed on one side of the heat-dissipating module, and the outlet 162 is disposed on the other side of the heat-dissipating module. Air may be introduced into the flow path 115 through the inlet 139. The introduced air may be discharged to the outside through the outlet 162. The size of the inlet 139 may be larger than the size of the outlet 162. The surface area of the inlet 139 may be larger than the surface area of the outlet 162. Accordingly, the air introduced from the inlet 139 may flow toward the outlet 162 at a higher speed.

A heat-dissipating fin 112 being protruded upward from an upper surface may be provided on an outer surface of the housing 110. The heat-dissipating fins 112 may be formed in a plate shape. Due to the heat-dissipating fin 112, the surface area of the outer surface of the housing 110 may increase, so that heat-dissipating efficiency may be improved. That is, heat generated from the heat-generating component disposed in the housing 110 may be discharged to the outside through the heat-dissipating fins 112.

A plurality of heat-dissipating fins 112 may be provided to be spaced apart from each other. A gap G (refer to FIG. 6) may be formed between adjacent heat-dissipating fins 112. The gap G is understood as a flow path through which the air discharged from the fan 180 flows. Accordingly, the gap G may also be referred to as a flow path 115.

In addition, the region where the heat-dissipating fins 112 are formed may be overlapped with the disposed region of the heat-generating component in an up-down direction. The region where the heat-dissipating fins 112 are formed may be overlapped with a partial region of the cover 160, which will be described later, in an up-down direction. That is, the cover 160 may cover an upper surface of the heat-dissipating fin 112.

Similarly, the plurality of flow paths 115 may be disposed in a region between adjacent heat-dissipating fins 112 to be overlapped with the heat-generating component in an up-down direction. The heat-generating component and the plurality of flow paths 115 may be disposed to be overlapped with one another in a vertical direction. Accordingly, when air flows into the plurality of flow paths 115, heat can be efficiently exchanged with heat generated from the heat-generating component.

A plurality of heat-dissipating fins 112 may include a first heat-dissipating fin 112a of a first length and a second heat-dissipating fin 112b disposed in a region between the adjacent first heat-dissipating fins 112a of a second length. Here, the first length may be longer than the second length. A region in which the plurality of first heat-dissipating fins 112a are disposed may be divided into a first region disposed at a first interval and a second region disposed at a second interval. Here, the first interval may be formed to be wider than the second interval. In addition, the second heat-dissipating fins 112b may be disposed in a region between the first heat-dissipating fins 112a adjacent to the region where the first gap is formed. The region in which the second gap is formed may be covered by the discharge unit 169 of the cover 160, which will be described later.

Meanwhile, the length L3 between the two heat-dissipating fins disposed on both outermost sides of the other side of the heat-dissipating member among the plurality of heat-dissipating fins 112 may be different from the length L2 between the two heat-dissipating fins disposed on both outermost sides of the central region M between the inlet 139 of the heat-dissipating member and the outlet 162. Here, the central region may be understood as an arbitrary region disposed between the inlet 139 and the outlet 162, and the other side of the heat-dissipating member may be understood as a region adjacent to the outlet.

In more detail, the length L3 between the two heat-dissipating fins disposed at the outermost side among the plurality of heat-dissipating fins 112 adjacent to the outlet 162 may be different from the length L1 between two heat-dissipating fins disposed at the outermost side among the plurality of heat-dissipating fins 112 relatively close to the inlet 139. The length L3 between the two heat-dissipating fins disposed at both outermost sides of the other side of the heat-dissipating member among the plurality of heat-dissipating fins may be shorter than the length L2 between the two heat-dissipating fins disposed at both outermost sides of the central region of the heat-dissipating member.

That is, as it is closer to the inlet 139, the length between the two heat-dissipating fins disposed at the outermost side may be longer. In addition, as it is closer to the outlet 162, the length between the two heat-dissipating fins disposed at the outermost side may be shorter. The length between the two heat-dissipating fins disposed on the outermost side may be a length of a straight line.

In other words, the length L1 between the two heat-dissipating fins disposed at a region relatively close to the fan 180 of the heat-dissipating member among the plurality of heat-dissipating fins 112 may be formed to be equal to or longer than the length L3 between the two heat-dissipating fins 112 disposed at a region relatively close to the outlet 162 of the heat-dissipating member.

In addition, the number of flow paths 115 on the other side of the heat-dissipating member may be different from the number of flow paths 115 at the center of the heat-dissipating member. The number of flow paths 115 adjacent to the outlet 162 may be different from the number of flow paths 115 relatively close to the fan 180. The number of flow paths 115 adjacent to the outlet 162 may be equal to or smaller than the number of flow paths 115 relatively close to the fan 180.

According to the above-described configuration, the air discharged from the fan 180 may pass through the flow path 115 and flow to the outlet 162 more quickly.

The heat-dissipating module may further include a cover 160 disposed on the plurality of heat-dissipating pins 112. The cover 160 may include an inlet 139 disposed adjacent to the fan 180 and an outlet 162 for discharging air.

The cover 160 may be coupled to an upper surface of the housing 110. The cover 160 may be coupled to cover at least a portion of an upper surface of the housing 110.

The cover 160 may cover an upper surface of the heat-dissipating fin 112. In a space formed by the upper surface of the housing 110 and the inner surface of the cover 160, a duct 117 (refer to FIG. 8) through which air discharged by a fan 180, which will be described later, flows may be formed. On an upper surface of the housing 110, a partition unit 116 being protruded upward to divide a region to which the cover 160 is coupled and other region may be disposed.

As described above, the cover 160 is coupled to an upper surface of the housing 110 so as to cover the upper surface of the heat-dissipating pin 112. In addition, a discharge unit 169, through which air flowing through the duct 117 is discharged, may be formed at one end of the cover 160. An outlet 162 for communicating the duct 117 and an external region may be formed in the discharge unit 169. The outlet 162 may be disposed in a region being overlapped with the power terminal 102 in an up-down direction.

The inner space of the cover 160 can be divided into a first region in which the fan 180 is disposed, a second region in which the heat-dissipating fins 112 are disposed, and the discharge unit 169. The first region, the second region, and the discharge unit 169 may be sequentially disposed along the lengthwise direction of the cover 160.

An inclined surface 168 may be formed in at least a portion among the side surface 161 of the cover 160 in a shape in which the width of the cover 160 is narrowed. The inclined surface 168 may be disposed in a region connecting a first region of the first heat-dissipating fin 112a and a second region of the first heat-dissipating fin 112a.

A fan 180 may be disposed inside the cover 160. The fan 180 may be disposed between the inner surface of the cover 160 and the upper surface of the housing 110. The fan 180 may be disposed in the first region of the cover 160.

Meanwhile, an imaginary line connecting the surface of the inlet 139 and the surface of the outlet 162 may form a predetermined angle with the side surface of the housing 110. Also, the inner surface of the inlet 139 and the inner surface of the outlet 162 may be formed not to be parallel to the side surface of the housing 110.

The fan 180 may discharge air by driving. The fan 180 may suck air from an external region of the housing 110 and discharge the sucked air into the duct 117. To this end, the fan 180 may include a plurality of blades 183 that are radially disposed centered around a rotation shaft 182 and rotate. The fan 180 may be electrically connected to a printed circuit board 107 to receive power required for driving or receive an input signal for control. Accordingly, when the temperature of the space in the housing 110 is equal to or higher than the reference temperature, a control unit may drive the fan 180. A temperature sensor (not shown) for temperature sensing may be additionally disposed in the housing 110.

Meanwhile, an opening 165 for exposing the upper surface of the fan 180 upward may be formed on an upper surface of the cover 160. The opening 165 may be disposed to be overlapped with the fan 180 in a vertical direction.

In addition, a region 164 adjacent to the opening 165 among the upper surface of the cover 160 may have a shape that is protruded upward compared to other regions to accommodate a portion of the upper region of the fan 180.

When the fan 180 is driven, outside air may be introduced into the fan 180 through the opening 165 to flow downward of the fan 180. In this embodiment, the fan 180 may be an axial fan flowing air in a direction parallel to the rotation shaft 182.

Figure 6:
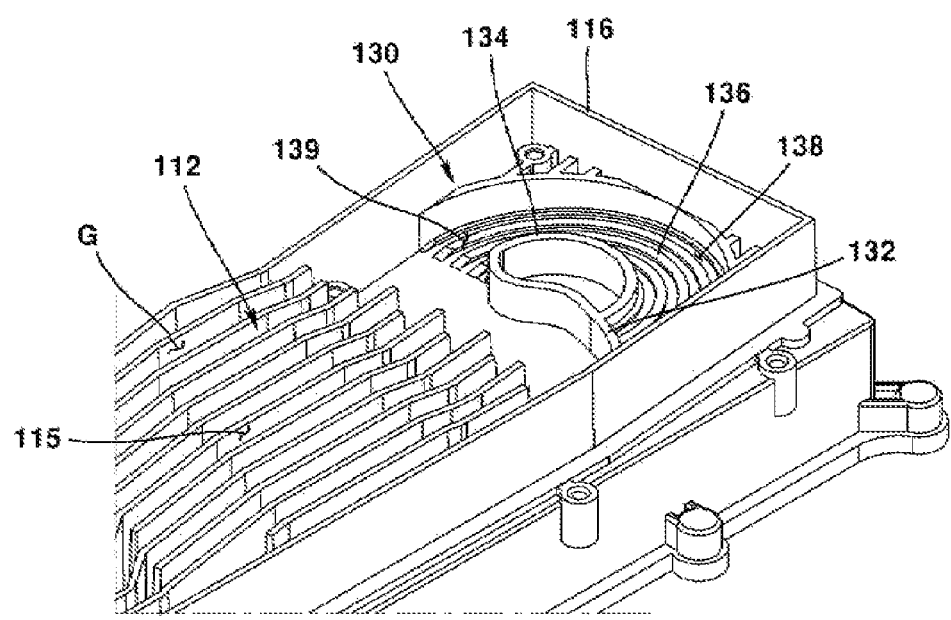
FIG. 6 is a perspective view illustrating a portion of an upper surface of the housing according to a first embodiment of the present invention.
Figure 7:
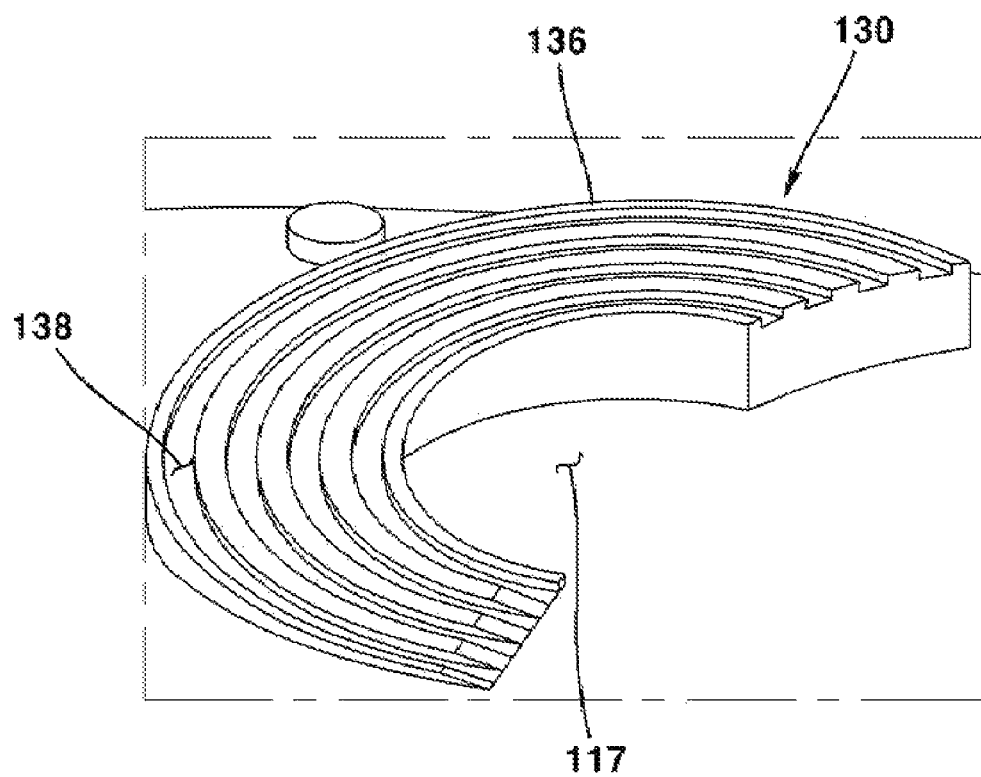
FIG. 7 is a perspective view illustrating an air guide according to a first embodiment of the present invention.
Figure 8:
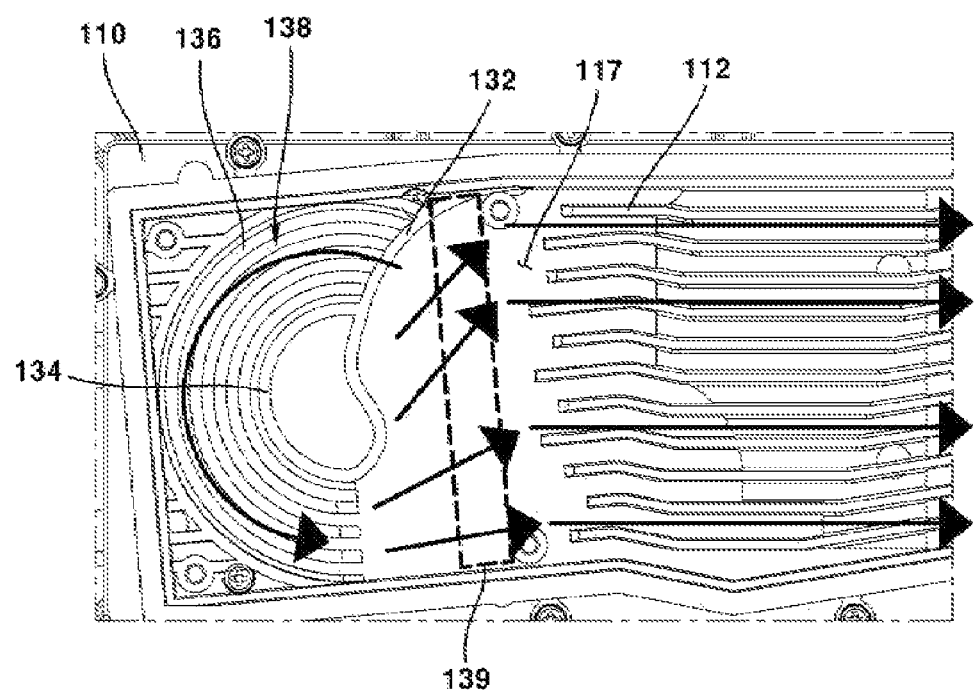
FIG. 8 is a view for describing the flow of air in a duct according to a first embodiment of the present invention.

FIG. 6 is a perspective view illustrating a portion of an upper surface of the housing according to a first embodiment of the present invention. FIG. 7 is a perspective view illustrating an air guide according to a first embodiment of the present invention. FIG. 8 is a view for describing the flow of air in a duct according to a first embodiment of the present invention.

Referring to FIGS. 4 to 8, an air guide 130 is disposed on the upper surface of the housing 110 according to the first embodiment of the present invention. The air guide 130 may be formed to be protruded upward a predetermined distance from an upper surface of the housing 110. The air guide 130 is disposed under the fan 180. The air guide 130 may guide the air discharged from the fan 180 to the heat-dissipating pin 112.

The air guide 130 may be formed in a shape having a curvature along a circumferential direction of the fan. When the cross-sectional shape of the fan 180 is circular, the air guide 130 may be disposed to have a semicircular cross-sectional shape in a region being overlapped with a portion of the fan 180 in an up-down direction.

The air guide 130 may be formed such that the protrusion height from the upper surface of the housing 110 decreases as it travels from one end to the other end. In other words, an inclined surface may be formed on the upper surface of the air guide 130 so that the distance to the upper surface of the housing 110 decreases as it travels from one end to the other end. One end and the other end of the air guide 130 may be a classification according to the flow sequence of the air. When the blade 183 of the fan 180 is rotated counter-clockwise with reference to FIG. 7, it can be defined such that a region placed in a relatively clockwise direction is one end of the air guide 130, and an end portion facing the one end is other end. Accordingly, the air discharged from the fan 180 may flow along the upper surface of the air guide 130 from the one end towards the other end.

On an upper surface of the air guide 130, an air groove 138 disposed between the plurality of air ribs 136 and the adjacent air ribs 136 may be disposed.

The plurality of air ribs 136 may be disposed to be stepped with respect to the bottom surface of the air groove 138. The air rib 136 may be formed to be protruded upward from the bottom surface of the air groove 138. The plurality of air ribs 136 may be disposed to be spaced apart from each other in a radial direction. Accordingly, the air groove 138 may be disposed between the adjacent air ribs 136. The plurality of air ribs 136 may be disposed to have a curvature along a circumferential direction of the fan with respect to the center of the fan 180.

The plurality of air ribs 136 may be formed to be protruded so that the protruded height from the upper surface of the housing 110 is getting higher as it travels towards the outer side. That is, the air rib 136 disposed relatively on an outer side may have a higher protrusion height from the upper surface of the housing 110 than that of the air rib 136 disposed on an inner side. Due to this, it is possible to prevent air from leaking towards the outer side of the air guide 130.

Accordingly, the surface area of the upper surface of the air guide 130 is increased by the air ribs 136, so that the air discharged from the fan 180 can be more easily discharged. In addition, the air discharged to the air groove 138 may be concentrated and discharged at a higher speed.

In a region of the housing 110 where one end of the air guide 130 is disposed, a partition 132 protruded upward from an upper surface of the housing 110 may be formed for partitioning an area in which the heat-dissipating pin 112 is disposed and a region in which the air guide 130 is disposed. The partition 132 may be formed to be extended outwardly from the central portion 134 of the air guide 130. Therefore, when air is discharged from the fan 180, the air may flow from one end of the air guide 130 towards the other end, and some air flow towards the region in which the heat-dissipating fin 112 disposed without passing through the air guide 130 can be prevented.

An inlet 139 for discharging air to the heat-dissipating pin 112 may be formed at the other end of the air guide 130. Accordingly, the air flowing along the upper surface of the air guide 130 may flow to the region in which the heat-dissipating fin 112 is disposed through the inlet 139. That is, it may be understood that the region in which the air guide 130 is disposed and the region in which the heat-dissipating fin 112 is disposed are being communicated with each other through the inlet 139.

Meanwhile, the angle at which air is discharged from the inlet 139 may be formed to be inclined at a predetermined angle with respect to the side surface of the housing 110. As shown in FIG. 3, when an imaginary center line L is drawn to be parallel to a side surface with a relatively wide cross-sectional area among the side surfaces of the housing 110, the angle at which air is discharged from the inlet 139 may be formed to have an angle Φ with the center line L. The Φ may be an acute angle. That is, since the discharge unit 162 of the cover 160 is disposed relatively close to one corner of the housing 110 and the air discharge unit 138 is disposed adjacent to the other corner opposite to the one corner with respect to the center of the housing 110, the air flowing through the duct 117 flows in the diagonal direction of the housing 110, and thereby air can move more quickly in the region between the heat-dissipating fins 112. That is, the flow of air in the duct 117 flows in the shortest distance, so there is an advantage in that heat-dissipating efficiency is improved.

In addition, the lengthwise direction of the heat-dissipating pin 112 is also formed to correspond to the diagonal direction of the housing 110 on the upper surface of the housing 110, so that the air flow space can be secured more widely.

Figure 9A:
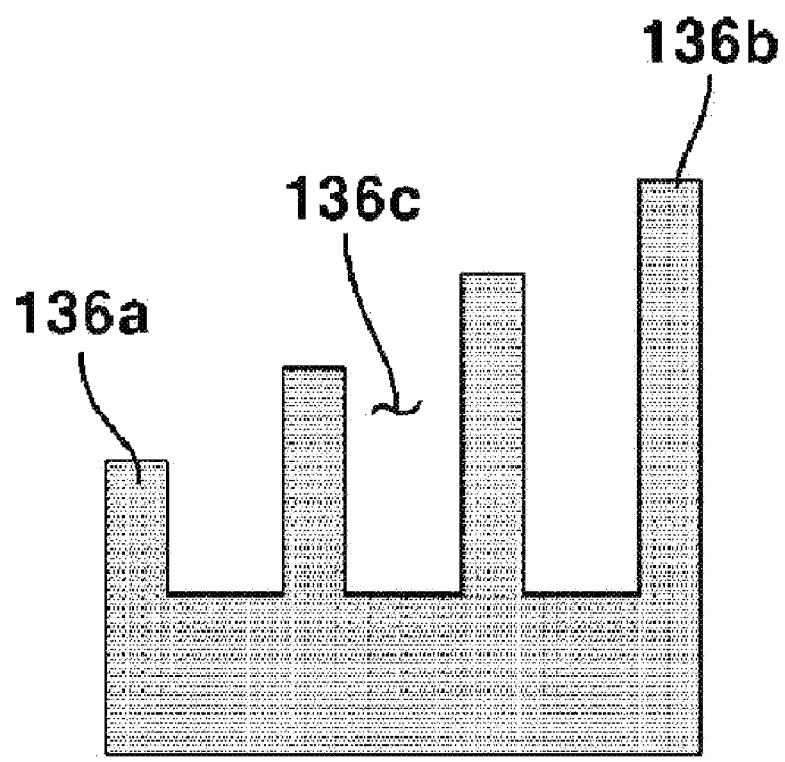
FIG. 9a is a cross-sectional view of an air guide according to a first embodiment of the present invention.

FIG. 9a is a cross-sectional view of an air guide according to a first embodiment of the present invention.

Referring to FIG. 9a, the plurality of air ribs 136 may be formed to be protruded upward from an upper surface of the housing 110 towards the outer side. In this case, an air gap 136c may be formed between the adjacent air ribs 136. According to FIG. 8a, the height of the bottom surface of the air gap 136c may be formed to have the same height as the bottom surface of the adjacent air gap 136c.

Figure 9B:
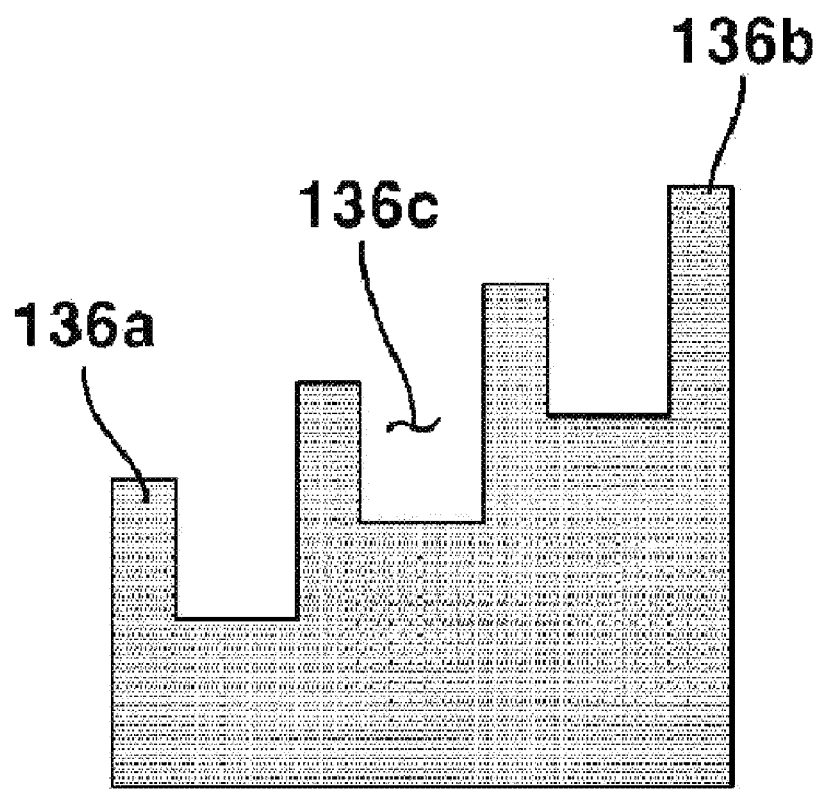

Referring to FIG. 9b, the height of the bottom surface of the air gap 136a may be different from each other. That is, the height of the bottom surface of the plurality of air gaps 136c may be formed to be higher as it travels towards the outer side. In other words, the height of the bottom surface of the plurality of air gaps 136c may be formed such that the height from the upper surface of the housing 110 increases as it travels towards the outer side.

Figure 10:
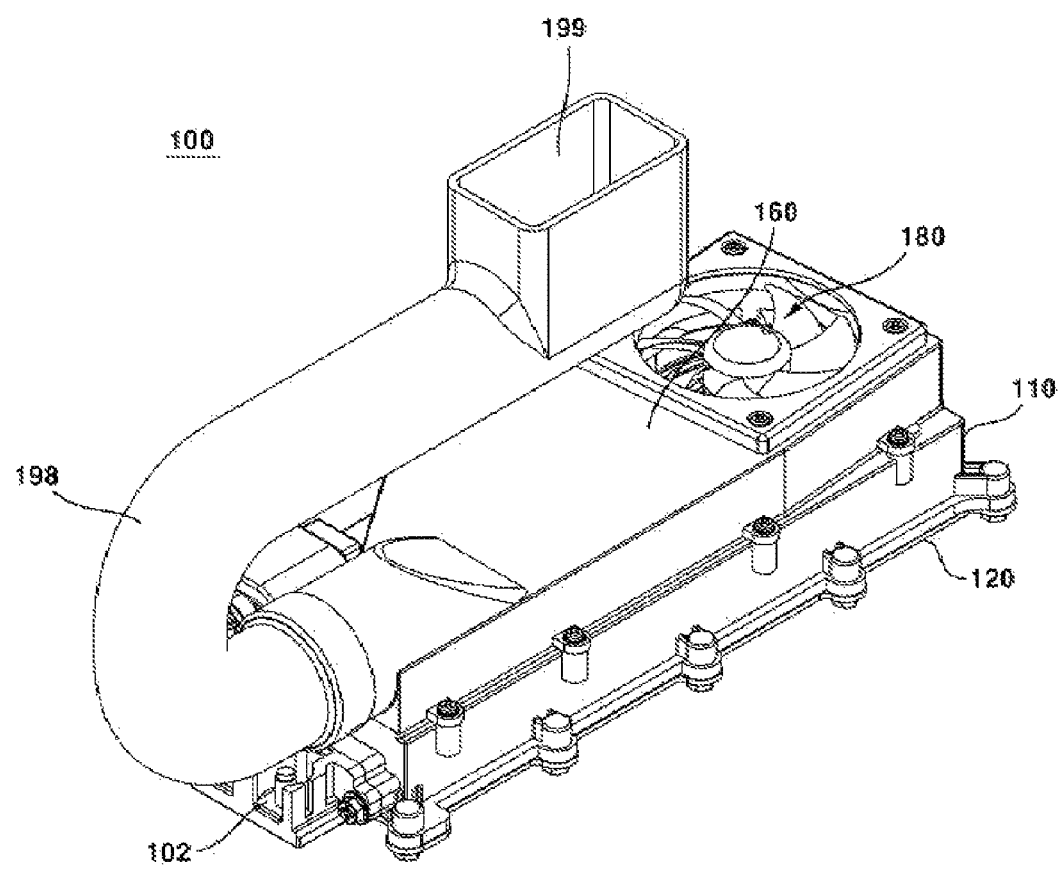
FIG. 10 is a perspective view showing a state in which an air pipe is coupled to the discharge unit according to a first embodiment of the present invention.

FIG. 10 is a perspective view showing a state in which an air pipe is coupled to the discharge unit according to a first embodiment of the present invention.

Referring to FIG. 10, the converter 100 may further include an air pipe 198. The air pipe 198 may have a flow path through which air flows therein. One end of the air pipe 198 is coupled to the discharge unit 169, and an air pipe discharge unit 199 is formed at the other end to discharge air discharged from the discharge unit 169 to the outside. The air pipe 198 may have a region bent at least once.

Therefore, according to the converter according to the present invention, since the air discharged from the fan 180 passes through the heat-dissipating fins 112 and is discharged to the outside, there is an advantage that heat-dissipating efficiency can be increased.

In addition, there is an advantage in that the air discharged from the fan through the air guide can be more easily guided to the duct.

In addition, since the wind speed can be increased more rapidly by flowing air in the diagonal direction of the housing, there is an advantage that the heat-dissipating effect can be maximized.

Figure 11:
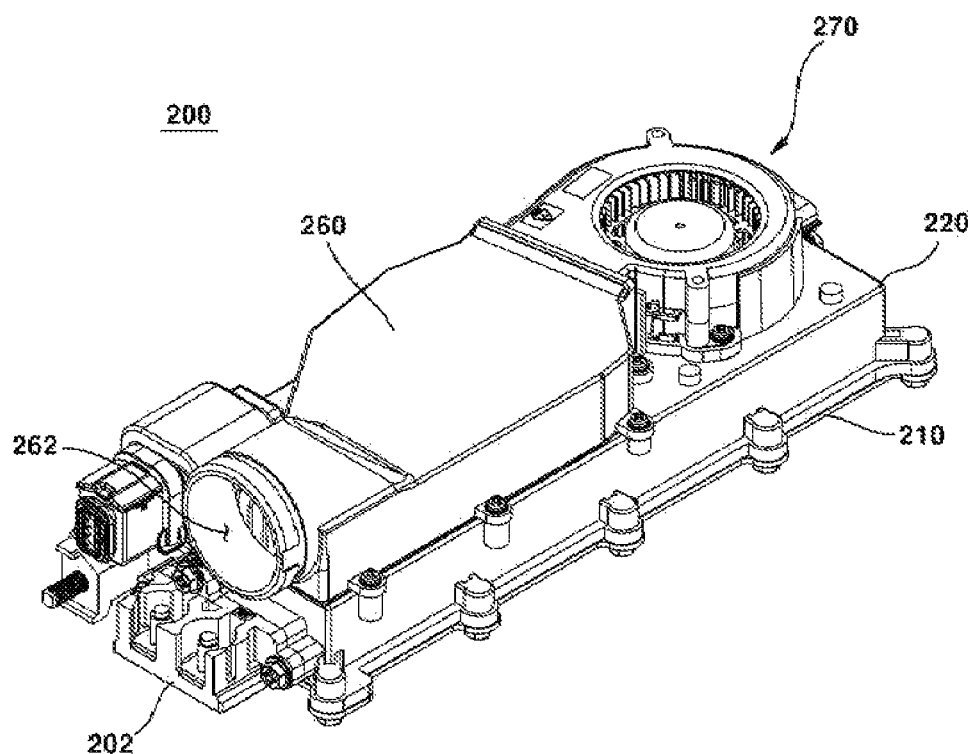
FIG. 11 is a perspective view of a converter according to a second embodiment of the present invention.
Figure 12:
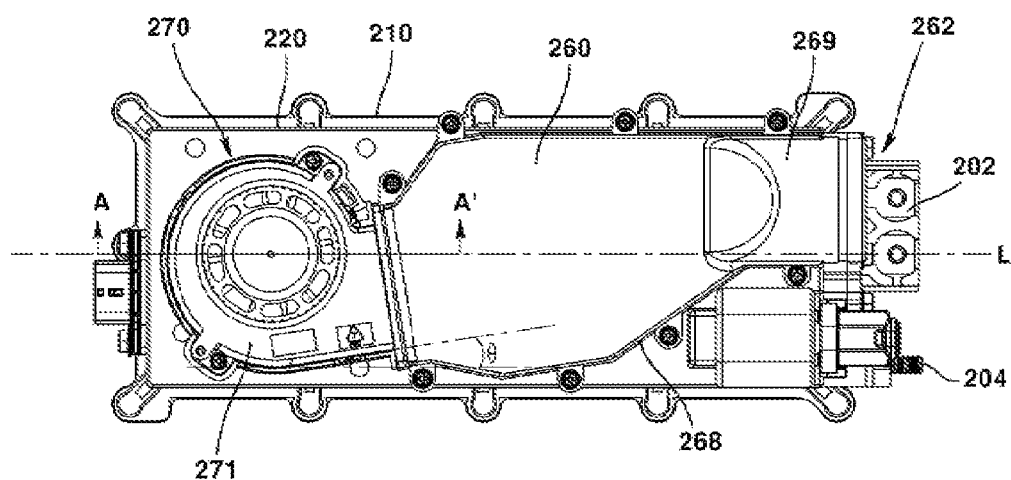
FIG. 12 is a plan view illustrating an upper surface of a converter according to a second embodiment of the present invention.
Figure 13:
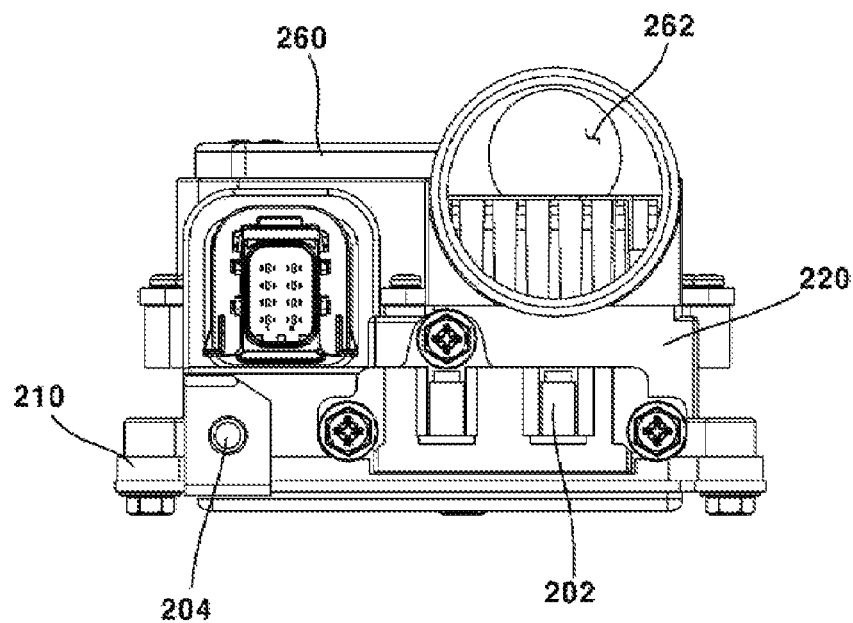
FIG. 13 is a plan view illustrating a side surface of a converter according to a second embodiment of the present invention.
Figure 14:
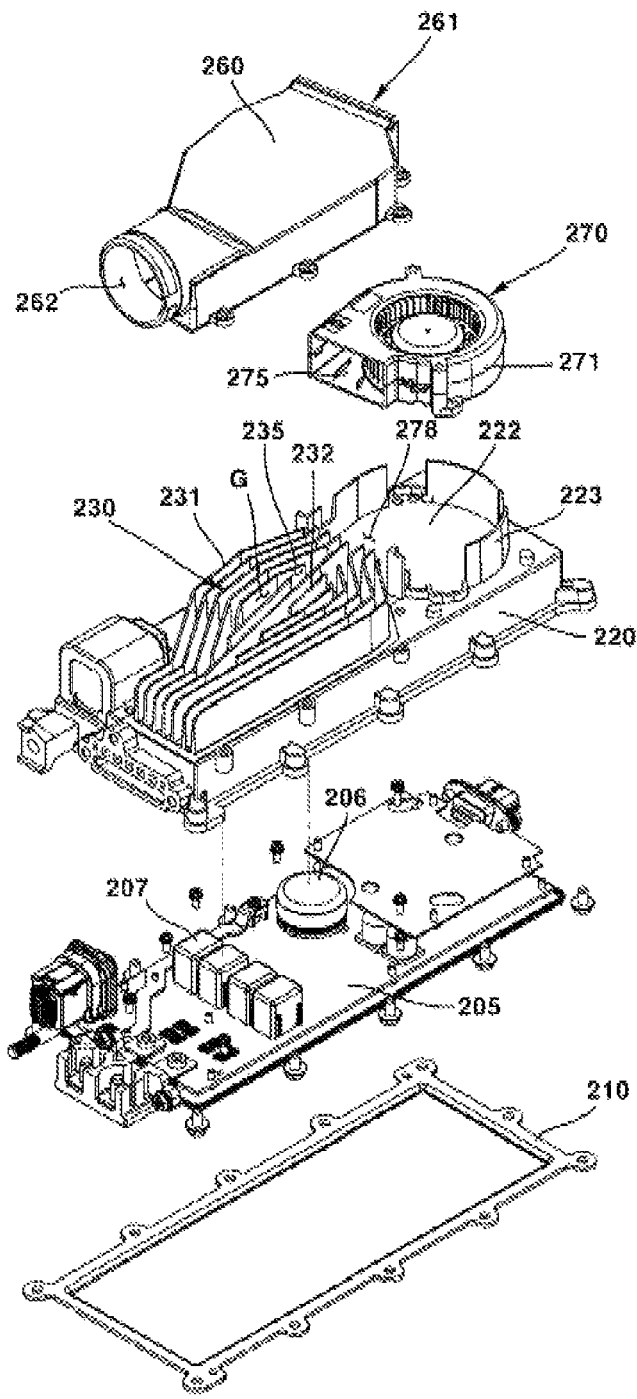
FIG. 14 is an exploded perspective view of a converter according to an embodiment of the present invention.
Figure 15:
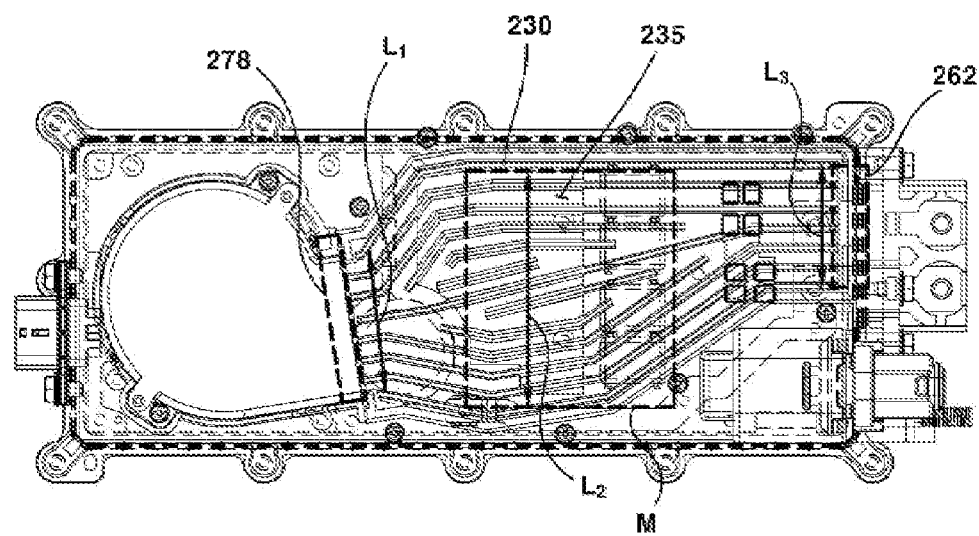
FIG. 15 is a plan view illustrating an upper surface of the converter illustrated in FIG. 12 excluding the cover.

FIG. 11 is a perspective view of a converter according to a second embodiment of the present invention, FIG. 12 is a plan view illustrating an upper surface of a converter according to a second embodiment of the present invention, FIG. 13 is a plan view illustrating a side surface of a converter according to a second embodiment of the present invention, FIG. 14 is an exploded perspective view of a converter according to an embodiment of the present invention, and FIG. 15 is a plan view illustrating an upper surface of the converter illustrated in FIG. 12 excluding the cover.

Referring to FIGS. 11 to 15, an external shape of the converter 200 according to the second embodiment of the present invention may be formed by the base 210 and the housing 220 coupled to the upper surface of the base 210. The housing 220 may be formed in a rectangular parallelepiped shape with an open lower surface. In addition, the base 210 may be coupled to a lower surface of the housing 220 to cover a space formed in the housing 220. However, this is an example, and of course, the converter 200 may be formed in a single housing structure in the form of a box.

The housing 220 may be formed of a metal material. For example, the material of the housing 220 may be aluminum.

A power terminal 202 and a signal terminal 204 may be respectively disposed on the side surface of the converter 200. The power terminal 102 and the signal terminal 104 are formed to be protruded outward from the side surface of the housing 220, and may be respectively coupled to external connectors. The power terminal 202 and the signal terminal 204 are electrically connected respectively to a heat-generating component (e.g., a printed circuit board 205) disposed inside the housing 220, so that when combined with an external connector, power or a signal from an external configuration may be transmitted or inputted to the converter 200. A through hole (not shown) through which the power terminal 202 and the signal terminal 204 penetrate may be formed in a side surface of the housing 220.

A plurality of heat-generating components for driving the converter 200 may be disposed in a space inside the housing 220. For example, a printed circuit board 205 on which one or more devices are mounted may be disposed in the housing 220. The printed circuit board 205 may be formed in a plate shape, and a plurality of heat-generating components may be disposed on an upper surface of the printed circuit board 205. The printed circuit board 205 may be provided in plurality, and may be disposed by forming layers in an up-down direction. As described above, the printed circuit board 205 may be electrically connected to the power terminal 102 and the signal terminal 104, respectively.

One or more heat-generating components that generate heat according to driving may be disposed in the housing 220. The heat-generating component may be disposed on an upper surface of the printed circuit board 205. The heat-generating component may include a transformer 206 for voltage regulation, an inductor for inductance, and one or more FET devices 207. Accordingly, heat may be generated from the heat-generating component according to the driving of the converter 200.

A heat-dissipating module is disposed on the housing 220. The heat-dissipating module may include a heat-dissipating member, an inlet 278 disposed on one side of the heat-dissipating member, and an outlet 262 disposed adjacent to the other side of the heat-dissipating member. In addition, the heat-dissipating member may include a plurality of heat-dissipating fins 230 and a plurality of flow paths 235 disposed in a direction from the inlet 278 towards the outlet 262.

In detail, the inlet 278 may be disposed on one side of the heat-dissipating module, and the outlet 262 may be disposed on the other side of the heat-dissipating module. Air may be introduced into the flow path 235 through the inlet 278. The introduced air may be discharged to the outside through the outlet 262. The size of the inlet 278 may be larger than the size of the outlet 262. The size of the cross-sectional area of the inlet 278 may be larger than the size of the cross-sectional area of the outlet 262. Accordingly, the air introduced from the inlet 278 may flow toward the outlet 262 at a higher speed.

A heat-dissipating pin 230 being protruded upward from an upper surface may be provided on an outer surface of the housing 220. The heat-dissipating fin 230 may be formed in a plate shape. Due to the heat-dissipating pin 230, the surface area of the outer surface of the housing 220 may increase, so that heat-dissipating efficiency may be improved. That is, heat generated from the heat-generating component disposed in the housing 220 may be discharged to the outside through the heat-dissipating fin 230.

The heat-dissipating fins 230 may be provided in plurality and disposed to be spaced apart from each other. A gap G may be formed between adjacent heat-dissipating fins 230.

The gap G is understood as a flow path through which the air discharged from the fan 270 flows. Accordingly, the gap G may also be referred to as a flow path 235.

In addition, the region where the heat-dissipating fins 230 are formed may be overlapped with a region in which the heat-generating component is disposed in an up-down direction. The region where the heat-dissipating fins 230 are formed may be overlapped with a partial region of the cover 260, which will be described later, in an up-down direction. That is, the cover 260 may cover the upper surface of the heat-dissipating fin 230.

Similarly, the plurality of flow paths 235 may be disposed in a region between adjacent heat-dissipating fins 230 to be overlapped with the heat-generating component in an up-down direction. The heat-generating component and the plurality of flow paths 235 may be disposed to be overlapped in a vertical direction. Accordingly, when air flows inside the plurality of flow paths 235, heat generated from the heat-generating component may be efficiently heat-exchanged.

A plurality of heat-dissipating fins 230 may include a first heat-dissipating fin 231 of a first length and a second heat-dissipating fin 232 of a second length disposed in a region between adjacent first heat-dissipating fins 231. Here, the first length may be longer than the second length. A region in which the plurality of first heat-dissipating fins 231 are disposed may be partitioned into a first region disposed at a first interval and a second region disposed at a second interval. Here, the first interval may be formed to be wider than the second interval. In addition, the second heat-dissipating fins 232 may be disposed in a region between the first heat-dissipating fins 231 adjacent to the region where the first gap is formed. The region where the second gap is formed may be covered by the discharge unit 269 of the cover 260.

Meanwhile, the length L3 between the two heat-dissipating pins disposed on both outermost sides of the other side of the heat-dissipating member among the plurality of heat-dissipating pins 230 may be different from the length L2 between two heat-dissipating fins disposed on both outermost sides of a central region between the inlet 278 and the outlet 262 of the heat-dissipating member. Here, the central region may be understood as an arbitrary region disposed between the inlet 278 and the outlet 262, and the other side of the heat-dissipating member may be understood as a region adjacent to the outlet.

In more detail, the length L3 between the two heat-dissipating pins disposed on the outermost side among the plurality of heat-dissipating pins 230 adjacent to the outlet 262 may be different from the length L1 between two heat-dissipating pins disposed on the outermost side among the plurality of heat-dissipating pins 230 relatively close to the inlet 278. The length L3 between two heat-dissipating pins disposed on both outermost sides of the other side of the heat-dissipating member among the plurality of heat-dissipating pins 230 may be shorter than the length L2 between two heat-dissipating pins disposed on both outermost sides of the central region of the heat-dissipating member.

That is, as it is closer to the inlet 278, the length between the two heat-dissipating fins disposed on the outermost side may be longer. In addition, as it is closer to the outlet 262, the length between the two heat-dissipating pins disposed on the outermost side may be shorter. The length between the two heat-dissipating pins disposed on the outermost side may be a length of a straight line.

In other words, the length L1 between the two heat-dissipating pins disposed in a region relatively close to the fan 270 of the heat-dissipating member among the plurality of heat-dissipating pins 230 may be equal to or larger than the length L3 between the outlet 262 of the heat-dissipating member and two heat-dissipating pins disposed in a relatively close region.

Also, the number of flow paths 235 on the other side of the heat-dissipating member may be different from the number of flow paths 235 at the center of the heat-dissipating member. The number of flow paths 235 adjacent to the outlet 262 may be different from the number of flow paths 235 relatively close to the fan 270. The number of flow paths 235 adjacent to the outlet 262 may be equal to or smaller than the number of flow paths 115 relatively close to the fan 270.

According to the above-described configuration, the air discharged from the fan 270 may pass through the flow path 235 and flow to the outlet 262 more rapidly.

The heat-dissipating module may further include a cover 160 disposed on the plurality of heat-dissipating pins 112. The cover 160 may include an inlet 278 (refer to FIG. 15) disposed adjacent to the fan 180 and an outlet 162 for discharging air.

The cover 260 may be coupled to an upper surface of the housing 220. The cover 260 may be coupled to cover at least a portion of the upper surface of the housing 220. The cover 260 may cover an upper surface of the heat-dissipating fin 230. In a space formed by the upper surface of the housing 220 and the inner surface of the cover 260, a duct 237 (refer to FIG. 16) through which air discharged by a fan 270, which will be described later, flows may be formed. In an upper surface of the housing 220, a partition (not shown) being protruded upwardly for partitioning a region to which the cover 260 is coupled and other region may be additionally disposed.

As described above, the cover 260 is coupled to an upper surface of the housing 220 so as to cover the upper surface of the heat-dissipating pin 230. In addition, a discharge unit 269, from which air flowing through the duct 237 is discharged, may be formed at one end of the cover 260. An outlet 262 for communicating the duct 237 and an external region may be formed in the discharge unit 269. The outlet 262 may be disposed in a region being overlapped with the power terminal 202 in an up-down direction.

The inner space of the cover 260 may be divided into a first region in which the heat-dissipating fins 230 are disposed, and the discharge unit 269. The first region and the discharge unit 269 may be sequentially disposed along the lengthwise direction of the cover 260.

An inclined surface 268 may be formed in at least a portion of the side surface of the cover 260 in a shape in which the width of the cover 260 is narrowed. The inclined surface 268 may be disposed in a region connecting a first region of the first heat-dissipating fin 231 and a second region of the first heat-dissipating fin 231.

Meanwhile, a sealing member (not shown) is disposed along the edge of the cover 260 between the cover 260 and the upper surface of the housing 220 so that the air in the duct 237 can be prevented from flowing to the outside.

A fan 270 may be disposed on an upper surface of the housing 220. The fan 270 may include a case 271 having an external shape and a fan outlet 275 formed on an outer surface of the case 271 to discharge air.

Meanwhile, an imaginary line connecting the surface of the inlet 278 and the surface of the outlet 262 may form a predetermined angle with the side surface of the housing 220. Also, the inner surface of the inlet 278 and the inner surface of the outlet 262 may be formed not to be parallel to the side surface of the housing 220.

The fan 270 may discharge air by driving. The fan 270 may suck in air from an external region and discharge the sucked air into the duct 237. To this end, the fan 270 may include a plurality of blades 279 that are radially disposed about the rotation shaft 277 and rotate. In addition, an air-sucking opening may be formed on an upper surface of the case 271. Accordingly, the air introduced into the case 271 through the air-sucking opening may be discharged from the fan outlet 275 by the rotation of the blade 279. In this embodiment, the fan 270 may be a radial fan in which the blades 279 form a linear shape in the radial direction. Accordingly, the fan outlet 275 may be formed on a side surface of the case 271 to discharge air inside the case 271.

The fan 270 may be electrically connected to the printed circuit board 205 to receive power required for driving or receive an input signal for control. Accordingly, the control unit may drive the fan 270 when the temperature of the space inside the housing 220 is equal to or greater than the reference temperature. A temperature sensor (not shown) for temperature sensing may be additionally disposed inside the housing 220.

A fan mounting unit 223 may be provided on an upper surface of the housing 220 to surround the periphery of the fan 270 by being protruded more upward than other regions. Accordingly, the surface for mounting the fan 270 in the upper surface of the housing 220 may be partitioned from other regions by the fan mounting unit 223.

Figure 16:
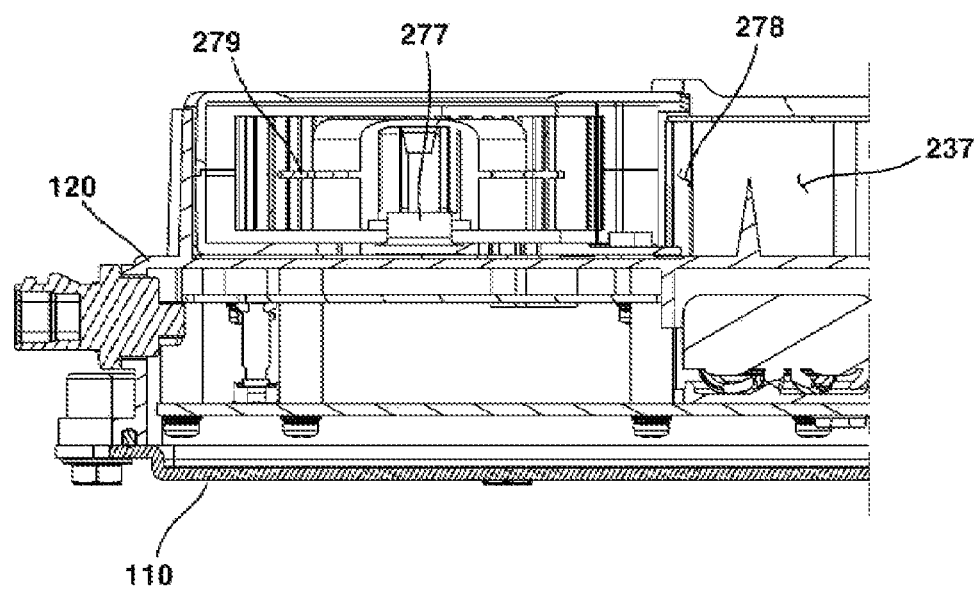
FIG. 16 is a cross-sectional view taken along line A-A' of FIG. 10.

FIG. 16 is a cross-sectional view taken along line A-A' of FIG. 10.

Referring to FIGS. 10 to 16, an inlet 278 and an outlet 262 may be formed on a side surface of the cover 260. The inlet 278 and the outlet 262 may be disposed to face each other with respect to the duct 237.

The inlet 278 may be coupled to the fan outlet 275. Accordingly, air discharged from the fan 270 may be introduced into the inlet 278 through the fan outlet 275. A cross-sectional area of the inlet 278 is formed to be larger than a cross-sectional area of the fan outlet 275, so that a portion of the fan 270 may be coupled to the inlet 278. In addition, a sealing member is disposed between the outer surface of the fan 270 coupled to the inlet 278 and the inner surface of the inlet 278 to prevent air from flowing to the outer region.

Meanwhile, the angle at which air is sucked from the inlet 278 and the angle at which air is discharged from the fan outlet 275 may be formed to be inclined at a predetermined angle with respect to the side surface of the housing 220. As in FIG. 11, when drawing an imaginary center line L parallel to the side with a relatively wide cross-sectional area among the side surface of the housing 220, an angle at which air is discharged from the fan outlet 275 may form an angle Φ with the center line L. In addition, the angle at which air is sucked from the inlet 278 may form an angle Φ with the center line L. The Φ may be an acute angle. That is, since the inlet 278 and the fan outlet 275 are disposed relatively close to one corner of the housing 220 and the outlet 262 is disposed adjacent to the other corner facing the one corner with respect to the center of the housing 110, air flowing through the duct 237 may flow in a diagonal direction of the housing 220. Accordingly, the air in the duct 237 may move faster between the regions between the heat-dissipating fins 230. That is, since the flow of air in the duct 237 flows in the shortest distance, there is an advantage in that heat-dissipating efficiency is improved.

In addition, the lengthwise direction of the heat-dissipating pin 230 is also formed to correspond to the diagonal direction of the housing 220 on the upper surface of the housing 220, so that the air flow space can be secured more widely.

Figure 17:
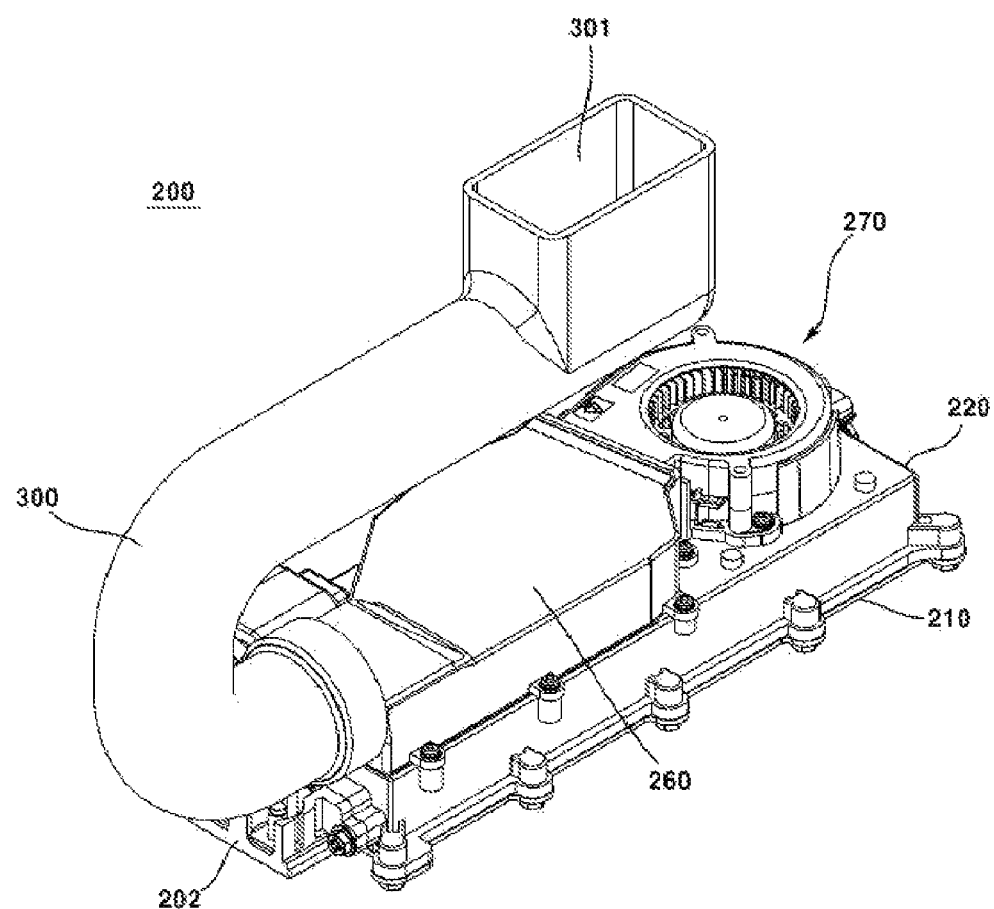
FIG. 17 is a perspective view illustrating a state in which an air pipe is coupled to a discharge outlet according to a second embodiment of the present invention.
Figure 18:
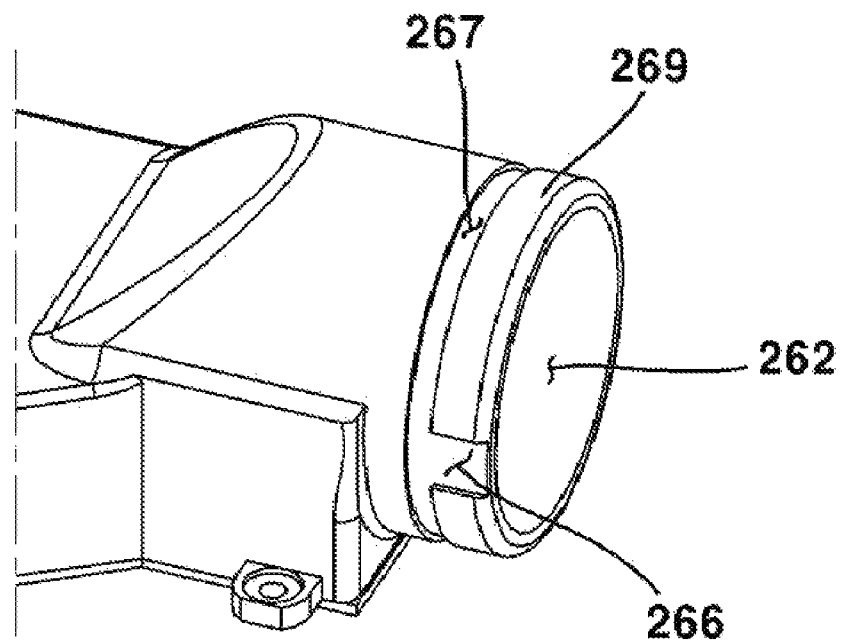
FIG. 18 is a perspective view of a discharge unit according to an embodiment of the present invention.
Figure 19:
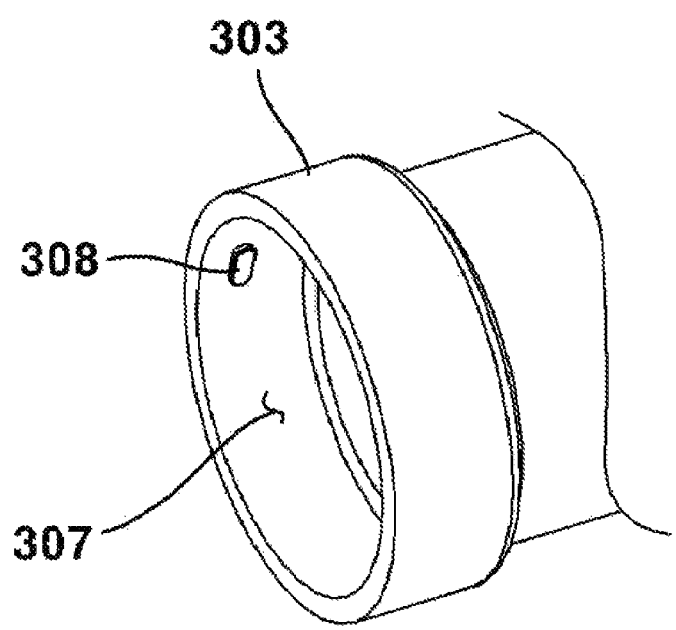
FIG. 19 is a perspective view illustrating an air pipe sucking opening according to an embodiment of the present invention.

FIG. 17 is a perspective view illustrating a state in which an air pipe is coupled to a discharge outlet according to a second embodiment of the present invention, FIG. 18 is a perspective view of a discharge unit according to an embodiment of the present invention, and FIG. 19 is a perspective view illustrating an air pipe sucking opening according to an embodiment of the present invention.

Referring to FIGS. 17 to 19, the converter 200 may further include an air pipe 300. The air pipe 300 may have a flow path 307 through which air flows therein. One end of the air pipe 300 may be coupled to the discharge unit 269, and the other end may be extended to an external region of the housing 220.

In more detail, an air pipe inlet 303 coupled to the discharge unit 269 is formed at one end of the air pipe 300, and an air pipe outlet 301 may be formed at the other end of the air pipe 300 so that the air flowing through the flow path 307 is discharged to the outside. The air pipe sucking opening 303 may be communicatively coupled to the outlet 262. Accordingly, the air discharged from the outlet 262 may pass through the flow path 307 and be discharged to the outside of the converter 200 through the air pipe outlet 301.

The air pipe 300 may include a region bent at least once or more.

Meanwhile, on an outer surface of the discharge unit 269, an inlet groove 266 being extended inwardly from an end portion of the discharge unit 269 and a locking groove 267 having a ring shape and disposed in a circumferential direction of the discharge unit 269 at an inner side of the inlet groove 266 may be formed.

In addition, a rib 308 being protruded inward may be disposed on an inner circumferential surface of the flow path 307 or an inner surface of the air pipe sucking opening 303.

Therefore, when the air pipe 300 and the discharge unit 269 are coupled, the rib 308 is slidingly moved along the inlet groove 266, and then rotated a predetermined angle in the locking groove 267 so that the rib 308 can be disposed in the locking groove 267.

Similarly, even when the air pipe 300 is separated from the discharge unit 269, the rib 308 is rotated at a predetermined angle to face the inlet groove 266, and then separated from the inlet groove 266 to the outer side so that the coupling can be released.

In the above, even though all the components constituting the embodiments of the present invention are described as being combined into one or operating in combination, the present invention is not necessarily limited to these embodiments. That is, within the scope of the object of the present invention, all the constituent elements may be selectively combined and operated in one or more. In addition, the terms 'include', 'consist of', or 'have' described above mean that the corresponding component can be present unless otherwise stated, so other components are excluded. Rather, it should be interpreted as being able to further include other components. All terms, including technical or scientific terms, have the same meaning as commonly understood by one of ordinary skill in the art, unless otherwise defined. Terms commonly used, such as terms defined in the dictionary, should be interpreted as being consistent with the meaning of the context of the related technology, and are not interpreted as ideal or excessively formal meanings unless explicitly defined in the present invention.

The above description is merely illustrative of the technical idea of the present invention, and those of ordinary skill in the art to which the present invention pertains will be able to make various modifications and variations without departing from the essential characteristics of the present invention. Accordingly, the embodiments disclosed in the present invention are not intended to limit the technical idea of the present invention, but to explain the technical idea, and the scope of the technical idea of the present invention is not limited by these embodiments. The scope of protection of the present invention should be interpreted by the following claims, and all technical ideas within the scope equivalent thereto should be construed as being included in the scope of the present invention.

The invention claimed is:

1. A converter comprising:
a housing;
a heat-generating component disposed inside the housing; and
a heat-dissipating module disposed on the heat-generating component,
wherein the heat-dissipating module includes includes:
a heat-dissipating member:
an inlet adjacently disposed on one side of the heat-dissipating member:
an outlet adjacently disposed on the other side of the heat-dissipating member; and
a fan disposed adjacent to the inlet,
wherein the heat-dissipating member includes:
a plurality of heat-dissipating fins disposed on an upper surface of the housing; and
a plurality of flow paths disposed in a direction from the inlet toward the outlet,
wherein the plurality of flow paths are disposed overlapping with the heat-generating component in the vertical direction,
wherein the plurality of heat-dissipating fins extend along a length of the heat-dissipating member in a first direction,
wherein a distance between two outermost heat-dissipating fins in a second direction of the heat-dissipating member, among the plurality of heat-dissipating fins, is greater at a central region between the inlet and the outlet of the heat-dissipating member than at a first region near the outlet of the heat-dissipating member,
wherein the second direction is transverse to the first direction,
wherein an angle at which air is discharged from the inlet is inclined at a predetermined angle from a side surface of the housing,
wherein the converter further comprises an air guide disposed on the upper surface of the housing under the fan, the air guide being for guiding air from the fan to the heat-dissipating fins,
wherein the air guide is formed such that a protrusion height from the upper surface of the housing decreases from one end to an other end,
wherein the air guide overlaps the inlet, and
wherein the air guide has a semi-circular cross-sectional shape.

2. The converter according to claim 1, wherein a number of flow paths at the other side of the heat-dissipating member is different from the number of flow paths in the central region of the heat-dissipating member.

3. The converter according to claim 1, wherein a flow path of the plurality of flow paths is formed between two heat-dissipating fins adjacent to each other.

4. The converter according to claim 1, wherein the distance between the two outermost heat-dissipating fins in the second direction of the heat-dissipating member at a second region near the inlet of the heat-dissipating member is equal to or greater than at the first region near the outlet of the heat-dissipating member.

5. The converter according to claim 1, wherein a number of flow paths at the other side of the heat-dissipating member is equal to or less than the number of flow paths at the one side.

6. The converter according to claim 1, wherein the heat-dissipating module includes a cover disposed on the plurality of heat-dissipating fins, and
wherein the cover includes the inlet and the outlet disposed adjacent to the fan.

7. The converter according to claim 1 wherein the heat-dissipating module includes the plurality of heat-dissipating fins and a cover disposed on the fan, and the cover includes an opening being overlapped with the fan in a vertical direction.

8. The converter according to claim 1, wherein the heat-generating component is plural, and
wherein each of the plurality of flow paths overlaps at least one of the plurality of heat-generating component in a vertical direction.

9. The converter according to claim 1, wherein the angle at which air is discharged from the inlet has an acute angle with the side surface of the housing.

10. The converter according to claim 1, wherein the air guide includes a partition portion disposed at the one end of the air guide for partitioning an arrangement area of the heat dissipating fins and an arrangement area of the air guide, and
wherein the inlet is disposed at the other end of the air guide.

11. The converter according to claim 1, wherein the air guide includes a plurality of air ribs and an air gap disposed between the air ribs, and
wherein the air ribs and the air gap are disposed to have a step difference from each other.

12. A converter comprising:
a housing;
a heat-generating component disposed inside the housing; and
a heat-dissipating module disposed on the housing,
wherein the heat-dissipating module includes:
a heat-dissipating member;
an inlet disposed adjacent to one side of the heat-dissipating member;
an outlet disposed adjacent to the other side of the heat-dissipating member; and
a fan disposed adjacent to the inlet,
wherein the heat-dissipating member includes:
a plurality of heat-dissipating fins disposed on an upper surface of the housing; and
a plurality of flow paths disposed in a direction from the inlet to the outlet, the plurality of flow paths are disposed to be overlapped with the heat-generating component in a vertical direction, and a size of the inlet is greater than a size of the outlet,
wherein the plurality of heat-dissipating fins extend along a length of the heat-dissipating member in a first direction,
wherein a distance between two outermost heat-dissipating fins in a second direction of the heat-dissipating member, among the plurality of heat-dissipating fins, is greater at a central region between the inlet and the outlet of the heat-dissipating member than at a first region near the outlet of the heat-dissipating member,
wherein the second direction is transverse to the first direction,
wherein the converter further comprises an air guide disposed on the upper surface of the housing under the fan, the air guide being for guiding air from the fan to the heat-dissipating fins,
wherein the air guide is formed such that a protrusion height from the upper surface of the housing decreases from one end to an other end,
wherein the air guide overlaps the inlet, and
wherein the air guide has a semi-circular cross-sectional shape.

13. The converter according to claim 12, wherein a number of flow paths at the other side of the heat-dissipating member is different from the number of flow paths in the central region of the heat-dissipating member.

14. The converter according to claim 13, wherein the number of flow paths at the other side of the heat-dissipating member is smaller than the number of flow paths in the central region of the heat-dissipating member.

15. The converter according to claim 12, wherein the distance between the two outermost heat-dissipating fins in the second direction of the heat-dissipating member at a second region near the inlet of the heat-dissipating member is equal to or greater than at the first region near the outlet of the heat-dissipating member.

16. The converter according to claim 12, wherein the air guide includes a partition portion disposed at the one end of the air guide for partitioning an arrangement area of the heat dissipating fins and an arrangement area of the air guide, and
wherein a height of the air guide decreases from the partition portion at the one end of the air guide to an outlet of the air guide at the other end of the air guide.

17. The converter according to claim 16, wherein the air guide includes a plurality of air ribs extending from the partition portion to the other end of the air guide, the plurality of air ribs having a semi-circular cross-sectional shape.

18. The converter according to claim 10, wherein a height of the air guide decreases from the partition portion at the one end of the air guide to an outlet of the air guide at the other end of the air guide, and
wherein the air guide includes a plurality of air ribs extending from the partition portion to the other end of the air guide, the plurality of air ribs having a semi-circular cross-sectional shape.

* * * * *